United States Patent
Jeong et al.

(10) Patent No.: US 8,017,513 B2
(45) Date of Patent: Sep. 13, 2011

(54) METHOD OF MANUFACTURING SEMICONDUCTOR ACTIVE LAYER, METHOD OF MANUFACTURING THIN FILM TRANSISTOR USING THE SAME AND THIN FILM TRANSISTOR HAVING SEMICONDUCTOR ACTIVE LAYER

(75) Inventors: Jong-han Jeong, Suwon-si (KR); Jae-kyeong Jeong, Suwon-si (KR); Jin-seong Park, Suwon-si (KR); Yeon-gon Mo, Suwon-si (KR); Hui-won Yang, Suwon-si (KR); Min-kyu Kim, Suwon-si (KR); Tae-kyung Ahn, Suwon-si (KR); Hyun-soo Shin, Suwon-si (KR); Hun Jung Lee, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 475 days.

(21) Appl. No.: 12/219,037

(22) Filed: Jul. 15, 2008

(65) Prior Publication Data

US 2009/0020753 A1 Jan. 22, 2009

(30) Foreign Application Priority Data

Jul. 16, 2007 (KR) .................. 10-2007-0071150

(51) Int. Cl.
*H01L 21/28* (2006.01)
(52) U.S. Cl. ......... 438/604; 257/E27.114; 257/E29.068; 257/43; 438/104

(58) Field of Classification Search .................. 257/43, 257/E27.114, E29.068; 438/104
See application file for complete search history.

(56) References Cited

U.S. PATENT DOCUMENTS

| 2006/0113539 | A1 | 6/2006 | Sano et al. |
| 2006/0231882 | A1 | 10/2006 | Kim et al. |
| 2007/0194379 | A1 | 8/2007 | Hosono et al. |
| 2009/0189153 | A1* | 7/2009 | Iwasaki et al. .................. 257/43 |

FOREIGN PATENT DOCUMENTS

| JP | 2000-044236 | | 2/2000 |
| JP | 2004-273614 | A | 9/2004 |
| JP | 2006-299412 | A | 11/2006 |
| JP | 2007-013098 | A | 1/2007 |
| JP | 2007-123699 | A | 5/2007 |
| KR | 10-2006-0123765 | A | 12/2006 |
| KR | 10-2007-0050143 | A | 5/2007 |
| WO | WO 2007/032294 | A | 3/2007 |
| WO | WO 2007032294 | A1 * | 3/2007 |

OTHER PUBLICATIONS

Nomura, K., et al., Nature (London) 432, 488 (2004).
Yabuta. H., et al., Appl. Phys. Lett. 89, 112123 (2006).

* cited by examiner

*Primary Examiner* — Thanh V Pham
*Assistant Examiner* — Marvin Payen
(74) *Attorney, Agent, or Firm* — Lee & Morse, P.C.

(57) ABSTRACT

A method of manufacturing an IGZO active layer includes depositing ions including In, Ga, and Zn from a first target, and depositing ions including In from a second target having a different atomic composition from the first target. The deposition of ions from the second target may be controlled to adjust an atomic % of In in the IGZO layer to be about 45 atomic % to about 80 atomic %.

20 Claims, 5 Drawing Sheets

METHOD OF MANUFACTURING SEMICONDUCTOR ACTIVE LAYER, METHOD OF MANUFACTURING THIN FILM TRANSISTOR USING THE SAME AND THIN FILM TRANSISTOR HAVING SEMICONDUCTOR ACTIVE LAYER

BACKGROUND OF THE INVENTION

1. Field of the Invention

Embodiments relate to a method of manufacturing a semiconductor active layer, a method of manufacturing a thin film transistor using the same, and a thin film transistor including the semiconductor active layer.

2. Description of the Related Art

A semiconductor layer using amorphous silicon or polysilicon has recently been developed for use in a thin film transistor (TFT) for light emitting display devices such as organic light emitting display devices, which use organic light emitting diodes (OLEDs) to emit light.

When the semiconductor layer is formed of amorphous silicon, the semiconductor layer may exhibit low mobility. The use of such a low mobility layer as a drive circuit of a display panel that requires a fast response time may be difficult. Polysilicon may be used as the semiconductor layer to provide high mobility, but the threshold voltage of the TFT may not be uniform. Additionally, leakage current may occur in the amorphous silicon or polysilicon semiconductor layer when light, e.g., light from a backlight unit, is incident thereon.

Oxide-based semiconductors may exhibit a band gap that is higher than the light energy in a visible light region. Accordingly, an oxide-based semiconductor may exhibit little or no leakage current resulting from visible light absorption. Therefore, the use of oxide-based semiconductors, e.g., semiconductors having an indium-gallium-zinc oxide (hereinafter, "IGZO") active layer, has been proposed as a solution to problems in the art. However, there is a need for further developments in the formation of an IGZO active layer, e.g., to provide control over the atomic composition thereof and improve the electrical characteristics of devices including the IGZO active layer.

SUMMARY OF THE INVENTION

Embodiments are therefore directed to a method of manufacturing a semiconductor active layer, a method of manufacturing a thin film transistor using the same, and a thin film transistor including the semiconductor active layer, which substantially overcome one or more of the problems due to the limitations and disadvantages of the related art.

It is therefore a feature of an embodiment to provide a method of manufacturing a semiconductor active layer, a method of manufacturing a thin film transistor using the same, and a thin film transistor including the semiconductor active layer, in which two or more targets are used.

It is therefore another feature of an embodiment to provide a method of manufacturing a semiconductor active layer, a method of manufacturing a thin film transistor using the same, and a thin film transistor including the semiconductor active layer, in which a rate of deposition from and/or composition of a second target is different from that of a first target.

At least one of the above and other features and advantages may be realized by providing a method of manufacturing an IGZO active layer, the method including depositing ions including In, Ga, and Zn from a first target, and depositing ions including In from a second target having a different atomic composition from the first target. The deposition of ions from the second target may be controlled to adjust an atomic % of In in the IGZO layer to be about 45 atomic % to about 80 atomic %.

The atomic % of In in the IGZO layer may be about 55 atomic % to about 75 atomic %. The atomic % of In in the IGZO layer may be about 60 atomic % to about 70 atomic %. The first target may include In, Ga, and Zn in a molar ratio of about 1:1:1. The first target may be made of InGaZnO, and the second target is made of InZnO. The first target may include In, Ga, and Zn in a molar ratio of about 1:1:1, and the second target may includes In and Zn in a molar ratio of about 1:1 to about 6:1 (In:Zn).

The atomic % of In in the IGZO layer may be adjusted by adjusting a molar ratio of In:Zn in the second target. First and second bias powers may be applied to the first target and the second target, respectively, and the atomic % of In in the IGZO layer may be adjusted by adjusting the intensity of the second bias power.

The first target and the second target may be irradiated with first and second pulsed lasers, and the atomic % of In in the IGZO layer may be adjusted by adjusting the intensity of the second pulsed laser.

At least one of the above and other features and advantages may also be realized by providing a method of manufacturing a thin film transistor, the method including forming an IGZO active layer on a substrate, forming a gate electrode spaced apart from the IGZO active layer by a gate dielectric layer, forming a source electrode that contacts a first portion of the IGZO active layer, and forming a drain electrode that contacts a second portion of the IGZO active layer. Forming the IGZO active layer may include depositing ions including In, Ga, and Zn from a first target, and depositing ions including In from a second target having a different atomic composition from the first target, the deposition of ions from the second target being controlled to adjust an atomic % of In in the IGZO layer to be about 45 atomic % to about 80 atomic %.

The atomic % of In in the IGZO layer may be about 55 atomic % to about 75 atomic %. The atomic % of In in the IGZO layer may be about 60 atomic % to about 70 atomic %. The first target may include In, Ga, and Zn in a molar ratio of about 1:1:1. The first target may be made of InGaZnO, and the second target may be made of InZnO. The first target may include In, Ga, and Zn in a molar ratio of about 1:1:1, and the second target may include In and Zn in a molar ratio of about 1:1 to about 6:1 (In:Zn).

The atomic % of In in the IGZO layer may be adjusted by adjusting a molar ratio of In:Zn in the second target. First and second bias powers may be applied to the first target and the second target, respectively, and the atomic % of In in the IGZO layer may be adjusted by adjusting the intensity of the second bias power. The first target and the second target may be irradiated with first and second pulsed lasers, and the atomic % of In in the IGZO layer may be adjusted by adjusting the intensity of the second pulsed laser.

The gate dielectric layer may be on the gate electrode such that the gate electrode is between the gate dielectric layer and the substrate, and the IGZO active layer may be on the gate dielectric layer. The gate dielectric layer may be on the IGZO active layer such that the IGZO active layer is between the gate dielectric layer and the substrate, and the gate electrode may be on the gate dielectric layer.

At least one of the above and other features and advantages may also be realized by providing a thin film transistor, including a substrate, an IGZO active layer on the substrate, the IGZO layer including a channel region, a source region, and a drain region, a gate electrode overlapping the channel region and insulated from the active layer by a gate insulator, and source and drain electrodes contacting the source and drain regions, respectively. An atomic % of In in the IGZO active layer may be about 45 atomic % to about 80 atomic %.

The atomic % of In in the IGZO active layer may be about 55 atomic % to about 75 atomic %.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION OF THE INVENTION

Figure 1:
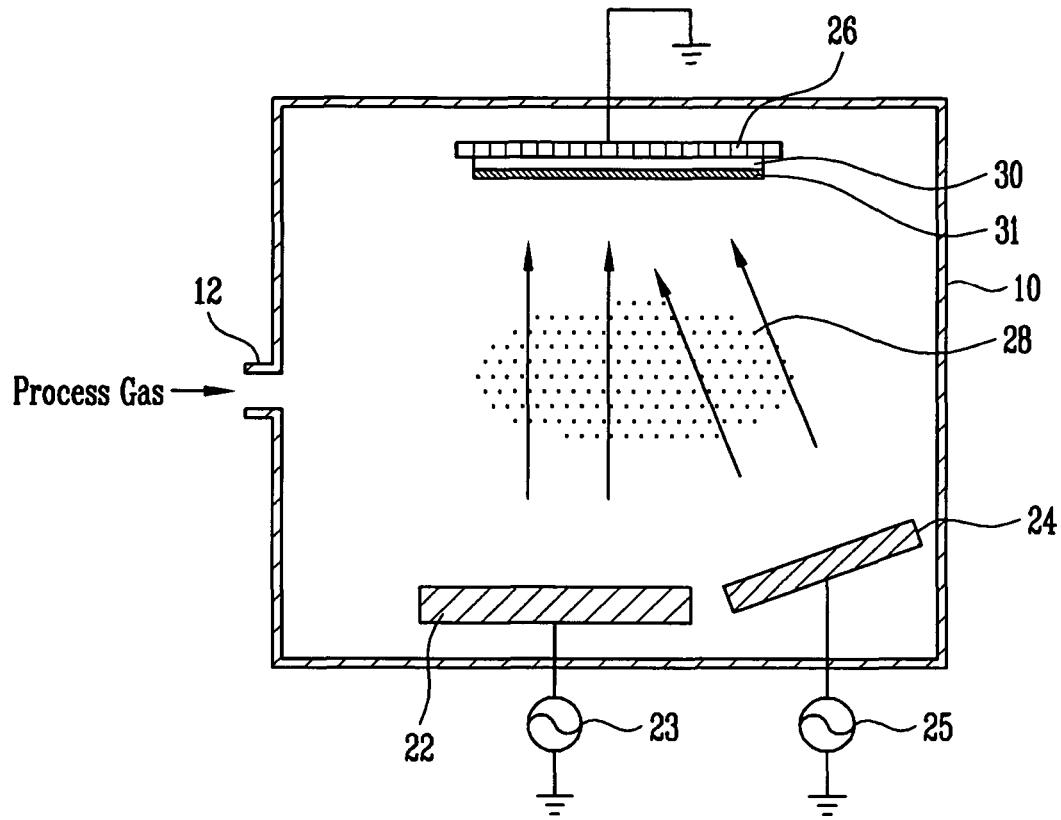
FIG. 1 illustrates a schematic view of a codeposition apparatus according to an embodiment.

Korean Patent Application No. 10-2007-0071150, filed on Jul. 16, 2007, in the Korean Intellectual Property Office, and entitled: "Method of Manufacturing Semiconductor Active Layer, Method of Manufacturing Thin Film Transistor Using the Same and Thin Film Transistor Having Semiconductor Active Layer," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an $n^{th}$ member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B and, C together, whereas the expression "either A, B, or C" means one of A alone, B alone, and C alone, and does not mean any of both A and B together; both A and C together; both B and C together; and all three of A, B and C together.

As used herein, the terms "a" and "an" are open terms that may be used in conjunction with singular items or with plural items. For example, the term "a gas" may represent a single component, e.g., argon, or multiple components in combination, e.g., argon mixed with oxygen.

As used herein, the terms "atomic ratio" and "molar ratio" are synonymous. Additionally, the terms "atomic percentage" and "atomic %" indicate the amount of one of indium (In), gallium (Ga), or zinc (Zn) relative to amount of indium, gallium and zinc combined, unless indicated otherwise.

Embodiments may provide a method of manufacturing a semiconductor active layer capable of increasing an atomic % of indium (In) in an IGZO semiconductor active layer. In the IGZO semiconductor, the mobility of a carrier (electrons) may increase if the relative amount of indium (In) is increased, and a concentration of the carrier (electrons) may decrease if the relative amount of gallium (Ga) is increased.

FIG. 1 illustrates a schematic view of a codeposition apparatus according to an embodiment. Referring to FIG. 1, ions of In, Ga and Zn may be deposited from a first target 22, e.g., a target made of InGaZnO, to form an IGZO layer 31 on a substrate 30, and ions of In may be deposited from a second target 24, e.g., a target made of InZnO, to adjust a compositional ratio of In in the IGZO layer. Thus, two targets 22 and 24, e.g., an InGaZnO target and an InZnO target, may be used to suitably control the atomic ratio of cations such as In, Ga and Zn in the active layer. This may provide better control over the compositional ratio of In, Ga and Zn cations in the IGZO layer than when employing a deposition operation using a single target.

FIG. 1 illustrates a cosputtering apparatus. It will be appreciated that other physical deposition operations, e.g., electron beam sputtering, pulsed laser deposition, etc., may also be used. As shown in FIG. 1, the first target 22 and the second target 24 may be disposed at one side of the inside of a chamber 10 having a gas inlet 12 and a gas outlet (not shown) formed therein. A first bias power 23 and a second bias power 25 may be applied to the first target 22 and the second target 24, respectively. A plate 26 may support the substrate 30, and may be disposed inside of the chamber 10 to face the first target 22 and the second target 24. The plate 26 may be coupled to a grounding conductor. In an implementation, the potential of the plate 26 may be varied depending on whether the first bias power 23 and the second bias power 25 are applied.

An inert gas, e.g., argon (Ar), and a carrier gas, e.g., oxygen ($O_2$), may be supplied as a process gas into the chamber 10 through the gas inlet 12. The amount of oxygen ($O_2$) supplied may be adjusted according to the desired electrical characteristics of the semiconductor active layer. In particular, a concentration of the carrier may be adjusted by adjusting the partial pressure of oxygen ($O_2$) in the process gas. For example, the concentration of the carrier may be decreased if the partial pressure of oxygen ($O_2$) is increased, and the concentration of the carrier may be increased if the partial pressure of oxygen ($O_2$) is decreased.

The first bias power 23 and the second bias power 25 may be applied to the InGaZnO target 22 and the InZnO target 24, respectively, while the process gas is supplied. An electric field may be formed between the plate 26 and the InGaZnO target 22 and InZnO target 24, and a high density plasma 28 may be generated by the bombardment of process gas molecules with electrons accelerated by an applied electromagnetic field. Cations of In, Ga and Zn may be deposited from the InGaZnO target 22, and cations of In and Zn may be deposited from the InZnO target 24 by the plasma 28 using a sputtering operation so as to form the IGZO active layer 31 on the substrate 30.

The compositional ratio (atomic %) of the cations of In, Ga, and Zn may be controlled according to the respective intensities of the first bias power 23 and the second bias power 25. For example, when the cations including In, Ga and Zn are deposited from the InGaZnO target 22 and the InZnO target 24 to form the IGZO active layer 31 on the substrate 30, the compositional ratio of In in the IGZO active layer 31 may be adjusted by increasing a speed for deposition of In and Zn ions from the InZnO target 24, e.g., a sputtering rate of the InZnO target 24 may be increased more than that of the InGaZnO target 22 by adjusting the intensity of the second bias power 25. Also, the amount of Ga in the IGZO active layer 31 may be set to about 10 atomic % or more. This may reduce or avoid the formation of excess carriers that may lead to unstable electrical characteristics, e.g., an increased OFF current or variations in threshold voltage.

In another implementation, the compositional ratio (atomic %) of the cations of In, Ga, and Zn may be controlled by adjusting the molar ratios of these elements in the InGaZnO target 22 and/or the InZnO target 24. For example, the molar ratio of In:Ga:Zn in the InGaZnO target 22 may be about 1:1:1, and the compositional ratio of In in the IGZO active layer 31 may be adjusted to about 45 atomic % to about 80 atomic % by increasing the amount of In in the InZnO target 24. For example, the molar ratio of In:Zn in the InZnO target 24 may be about 1:1 to about 6:1 (In:Zn). In other implementations, the compositional ratio of In in the IGZO active layer may be about 55 atomic % to about 75 atomic %, or about 60 atomic % to about 70 atomic %.

In another implementation, an electron beam sputtering apparatus may be used. Cations of In, Ga, and Zn may be deposited from the InGaZnO target 22 and the InZnO target 24 by irradiating the InGaZnO target 22 and the InZnO target 24 with first and second electron beams (not shown), thereby forming the IGZO active layer 31 on the substrate 30. In this case, the compositional ratio of the cations of In, Ga, and Zn in the IGZO active layer 31 may be adjusted according to the intensity of the first and second electron beams and/or the molar ratio of In, Ga, and Zn in the InGaZnO target 22 and the molar ratio of In and Zn in the InZnO target 24.

In another implementation, a pulsed laser deposition apparatus may be used. Cations of In, Ga, and Zn may be deposited from the InGaZnO target 22 and the InZnO target 24 by irradiating the InGaZnO target 22 and the InZnO target 24 with first and second pulsed lasers (not shown), thereby forming the IGZO active layer 31 on the substrate 30. In this case, the compositional ratio of the cations of In, Ga, and Zn in the IGZO active layer 31 may be adjusted according to the intensity of the first and second pulsed lasers and/or the molar ratio of In, Ga, and Zn in the InGaZnO target 22 and the molar ratio of In and Zn in the InZnO target 24.

The IGZO active layer 31 manufactured according to embodiments may have a composition where the cations are spatially non-uniform due to the use of two targets 22, 24. Thus, the relative ratio of In:Ga:Zn in the IGZO active layer 31 may vary across the substrate 30, i.e., it may vary according to (x, y) coordinates when mapped along X and Y axes that are parallel to the substrate 30. Therefore, the IGZO active layer 31 according to an embodiment may exhibit structural differences from an IGZO layer manufactured using a single target of InGaZnO.

A method of manufacturing a thin film transistor according to an embodiment will now be described in detail in connection with FIGS. 2A and 2B, which illustrate cross-sectional views of stages in a method of manufacturing a bottom gate (an inverted staggered bottom gate) thin film transistor according to an embodiment.

Figure 2A:
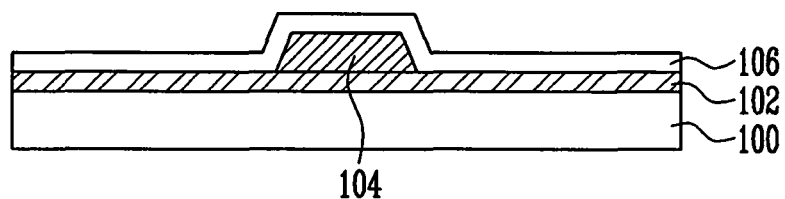
FIGS. 2A and 2B illustrate cross-sectional views of stages in a method of manufacturing a bottom gate thin film transistor according to an embodiment.

Referring to FIG. 2A, a buffer layer 102 may be formed on a substrate 100, and a gate electrode 104 may be formed on the buffer layer 102. A gate insulator 106 may be formed on the buffer layer 102 and on the gate electrode 104.

Figure 2B:
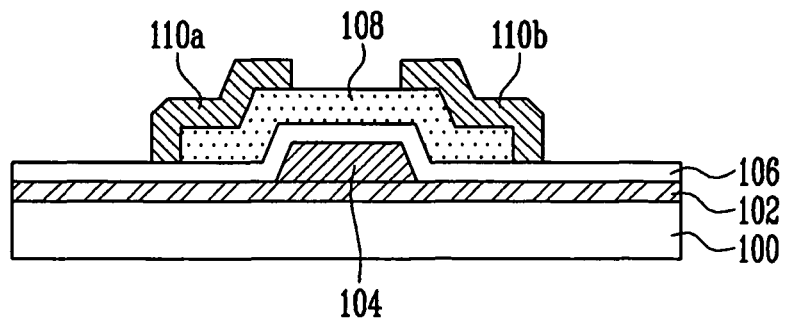

Referring to FIG. 2B, an IGZO active layer 108 providing a channel region, a source region and a drain region may be formed on the gate insulator 106. The active layer 108 may be formed according to an embodiment, e.g., as described above in connection with FIG. 1. The IGZO active layer may be formed on the substrate 100 by depositing ions, including In, Ga and Zn, from the InGaZnO target 22 and the InZnO target 24. The compositional ratio of In may be adjusted to, e.g., about 45 atomic % to about 80 atomic %, e.g., by adjusting the intensity of a bias power, adjusting the intensity of an electron beam or a pulse laser, or adjusting the molar ratios of the components of the InGaZnO target 22 and/or InZnO target 24. The IGZO active layer 108 may then be patterned, and source and drain electrodes 110a and 110b may be formed to contact the respective source and drain regions of the IGZO active layer 108.

EXAMPLES

A buffer layer was formed as a silicon oxide film ($SiO_x$) on a glass substrate, and 200 nm-thick tungsten molybdenum (MoW) was deposited thereon and then patterned to form a gate electrode on the buffer layer. The lateral dimensions of the gate electrode were 70 mm×70 mm.

A 200 nm-thick silicon nitride film ($SiN_x$) was deposited at a temperature of 330° C. using a plasma-enhanced chemical vapor deposition (PECVD) operation to form a gate insulator on the buffer layer and on the gate electrode. An IGZO active layer was formed on the gate insulator in an ambient temperature using a cosputtering apparatus. An amorphous phase of the IGZO active layer was formed having a thickness of 50 nm. The width and length of the channel region of the active layer were 1000 μm and 150 μm, respectively.

A first target of $In_2Ga_2ZnO_7$, i.e., InGaZnO, and a second target of $In_2O_3$-10 wt % ZnO (90 weight % $In_2O_3$ and 10 weight % ZnO), i.e., InZnO, were used to form the IGZO active layer. The internal pressure of the process chamber in the cosputtering apparatus was maintained at about 5 mTorr, and argon (Ar) and oxygen ($O_2$) were supplied as the process gas at a ratio of 65:35 (Ar:$O_2$). A radiofrequency (RF) bias power of 450 W was applied to the first target of $In_2Ga_2ZnO_7$, and a RF bias power of from 0 W to 700 W was applied to the second target of $In_2O_3$-10 wt % ZnO.

Then, the IGZO active layer was patterned and a 200 nm-thick transparent electrode material of indium zinc oxide (IZO) was deposited at ambient temperature. The electrode material was then patterned to form source and drain electrodes and on the entire upper surface, so that the source and drain electrodes were in contact with the source and drain regions, respectively, of the IGZO active layer. A shadow mask was used for the patterning operation, and the thin film transistor thus manufactured was heat-treated at a temperature of 350° C. for 1 hour.

Figure 3A:
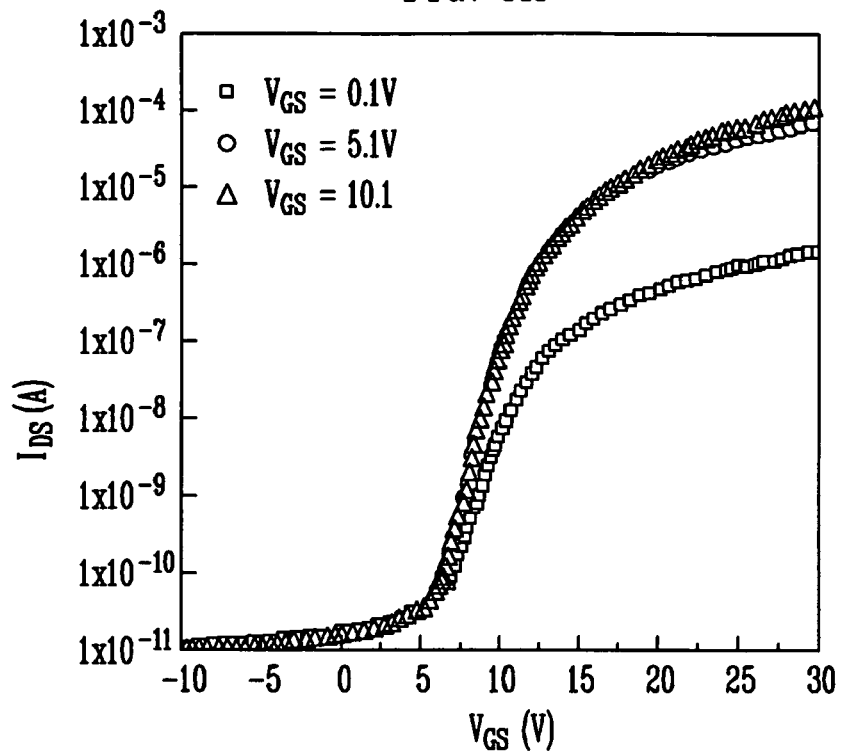
FIGS. 3A and 3B illustrate graphs showing transfer characteristics of a thin film transistor according to an embodiment.
Figure 3B:
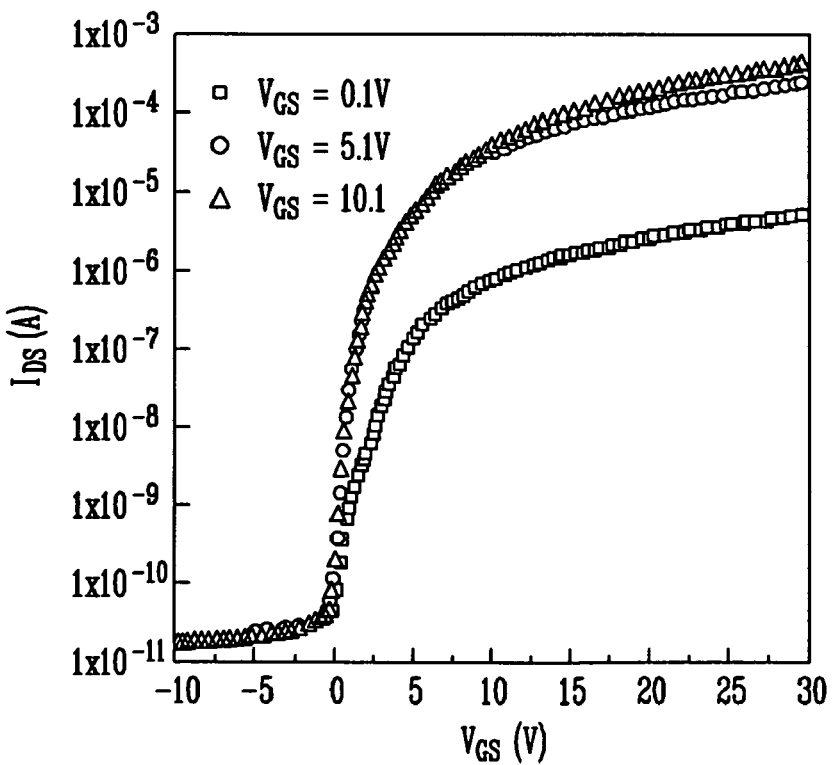

FIGS. 3A and 3B illustrate graphs showing transfer characteristics of thin film transistors manufactured according to the above-described operations. A semiconductor parameter analyzer (Agilent 4156C) was used to analyze electrical characteristics of the example thin film transistors (measurements were carried out at ambient temperature). FIG. 3A illustrates the results for a thin film transistor manufactured using a bias power of 0 W applied to the $In_2O_3$-10 wt % ZnO target. FIG. 3B illustrates the results for a thin film transistor manufactured using a bias power of 400 W applied to the $In_2O_3$-10 wt % ZnO target.

For a drain voltage ($V_{DS}$) of 5.1V and an electric current of L/W×10 nA flowing through the drain electrode, the threshold voltage ($V_{T,sat}$) is defined by a voltage applied to the gate electrode. Field-effect mobility ($\mu_{FE}$), which is induced at a drain voltage ($V_{DS} \leq 1V$) by transconductance, is determined by the following Equation 1.

$$\mu_{FE} = \frac{Lg_m}{WC_iV_{DS}} \quad \text{Equation 1}$$

In Equation 1, $C_i$ and $g_m$ are gate capacitance and transconductance per unit area, respectively. L and w are length and width, respectively.

A slope factor S (S factor) may be calculated from the transfer characteristics, as shown in the following Equation 2.

$$S = \frac{dV_{GS}}{d(\log I_{DS})} \quad \text{Equation 2}$$

In Equation 2, $I_{DS}$ is the saturated drain current, and $V_{GS}$ is the voltage between the gate and source.

The density of interface trap states ($N_t$) and dielectric interface in the amorphous IGZO active layer may be obtained using the following Equation 3.

$$N_t = [S\log(e)/(kT/q) - 1]\frac{C_i}{q} \quad \text{Equation 3}$$

When the bias power applied to the second target was adjusted to 0 W, N-channel conductivity having a mobility ($\mu_{FE}$) of 11.2±2.0 cm²/Vs was observed in the thin film transistor. The field effect transistor (FET) using the amorphous IGZO layer as a channel was normally off and operated in an accumulation mode (threshold voltage ($V_{T,sat}$)=8.14±0.36 V). The slope factor S (S factor) and the ON/OFF current ratio ($I_{on/off}$) were 1.11±0.06 V/dec and ~6.6×10⁶, respectively.

When the bias power applied to the second target was adjusted to 400 W, an improvement of important performance characteristics was observed in the thin film transistor. The OFF current ($I_{off}$) (~1.7×10⁻¹¹ A) was not reduced, and the mobility ($\mu_{FE}$) and the slope factor S were improved to 19.3±0.70 cm²/Vs and 0.35±0.02 V/dec, respectively. Also, the threshold voltage ($V_{T,sat}$) was changed to slightly more than 0 V (0.59 V), which may be an important factor in reducing power consumption of the organic light emitting display apparatus.

Figure 3C:
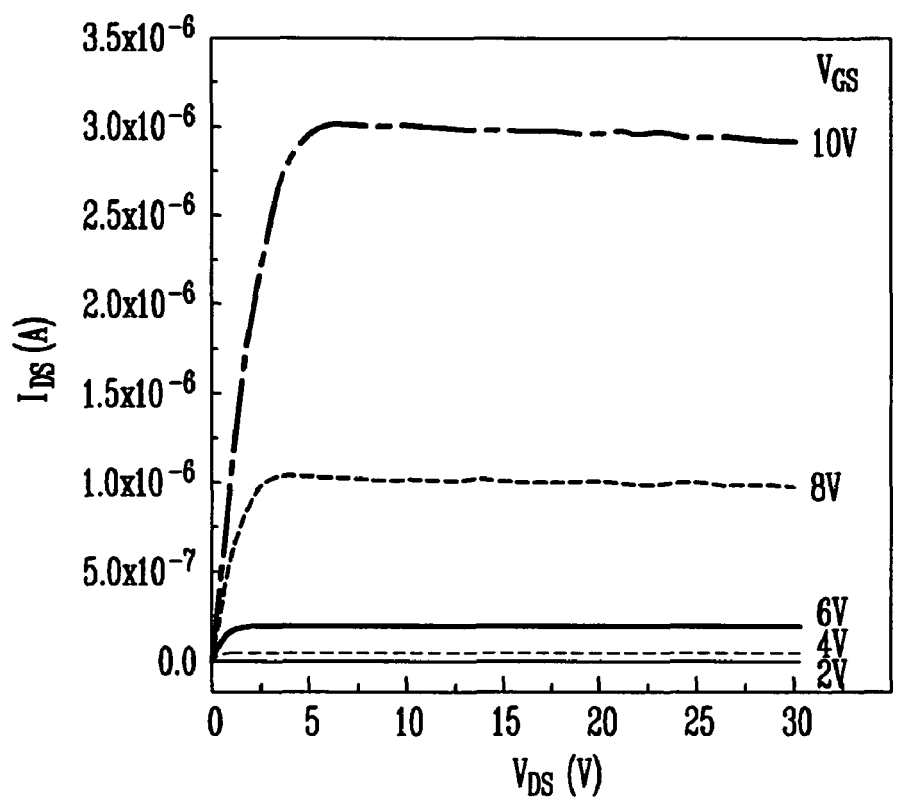
FIGS. 3C and 3D illustrate graphs showing power characteristics of a thin film transistor according to an embodiment.
Figure 3D:
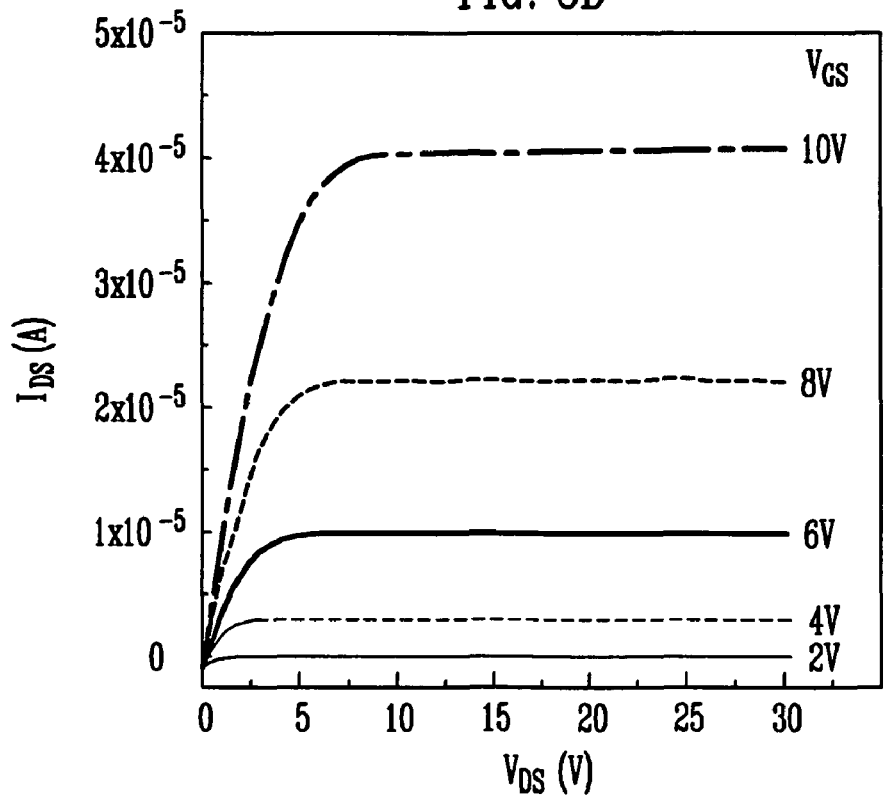

FIGS. 3C and 3D show the results obtained by measuring output characteristics of the thin film transistor manufactured according to the above-described operations. FIG. 3C shows the results for a bias power of 0 W applied to the second target, i.e., the $In_2O_3$-10 wt % ZnO target. FIG. 3D shows the results for a bias power of 400 W applied to the second target.

As indicated by the change in the drain current ($I_{DS}$), the thin film transistor according to an embodiment showed pinch-off and saturation characteristics as in the case of the field effect transistor (FET). An organic light emitting display apparatus requires a drain current ($I_{DS}$) of about 1 µA to display full white grayscale.

When the bias power applied to the second target was 0 W, the thin film transistor had a saturated drain current ($I_{DS}$) of about 1.0 µA when a voltage ($V_{GS}$) between the gate and source was 8 V. When the bias power applied to the second target was 400 W, the thin film transistor had a saturated drain current ($I_{DS}$) of about 1.0 µA when a voltage ($V_{GS}$) between the gate and source was 1V~4V.

Figure 4:
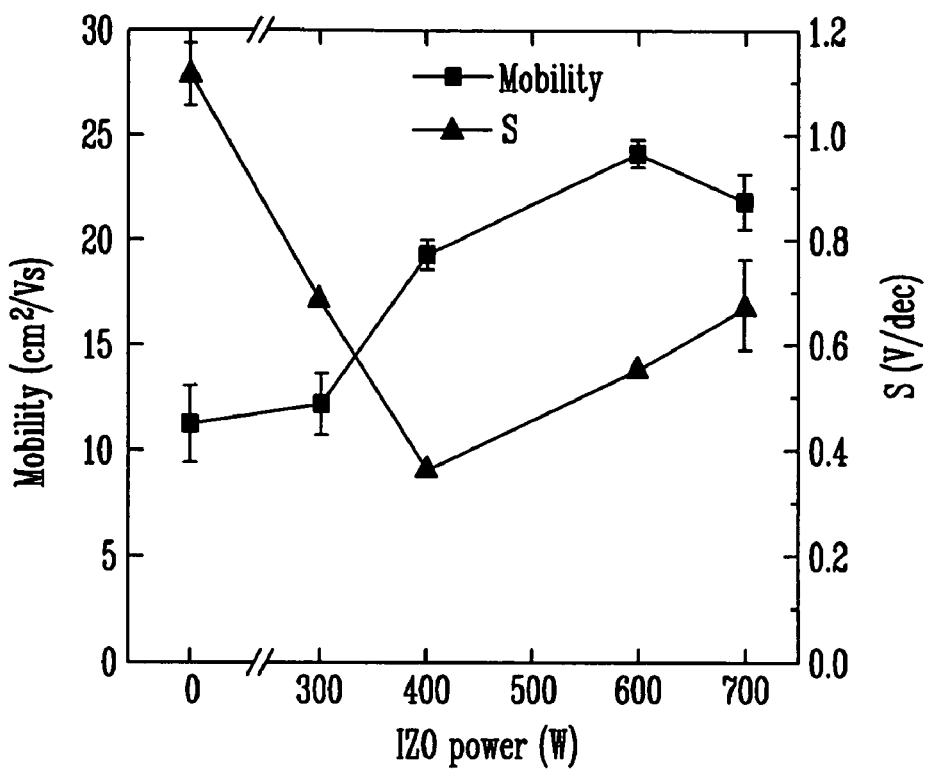
FIG. 4 illustrates a graph showing mobility and slope factor characteristics of a thin film transistor according an embodiment.

FIG. 4 illustrates a graph of mobility ($\mu_{FE}$) and slope factor S characteristics of the thin film transistor with respect to the bias power applied to the second target, i.e., the $In_2O_3$-10 wt % ZnO ("InZnO") target. As shown in FIG. 4, the mobility ($\mu_{FE}$) generally increased as the bias power applied to the InZnO target increased. When the bias power increased up to 600 W, the mobility increased to 24.0±0.64 cm²/Vs. Above 600 W the mobility slightly decreased, to 21.7±1.39 cm²/Vs when the bias power was 700 W.

Figure 5:
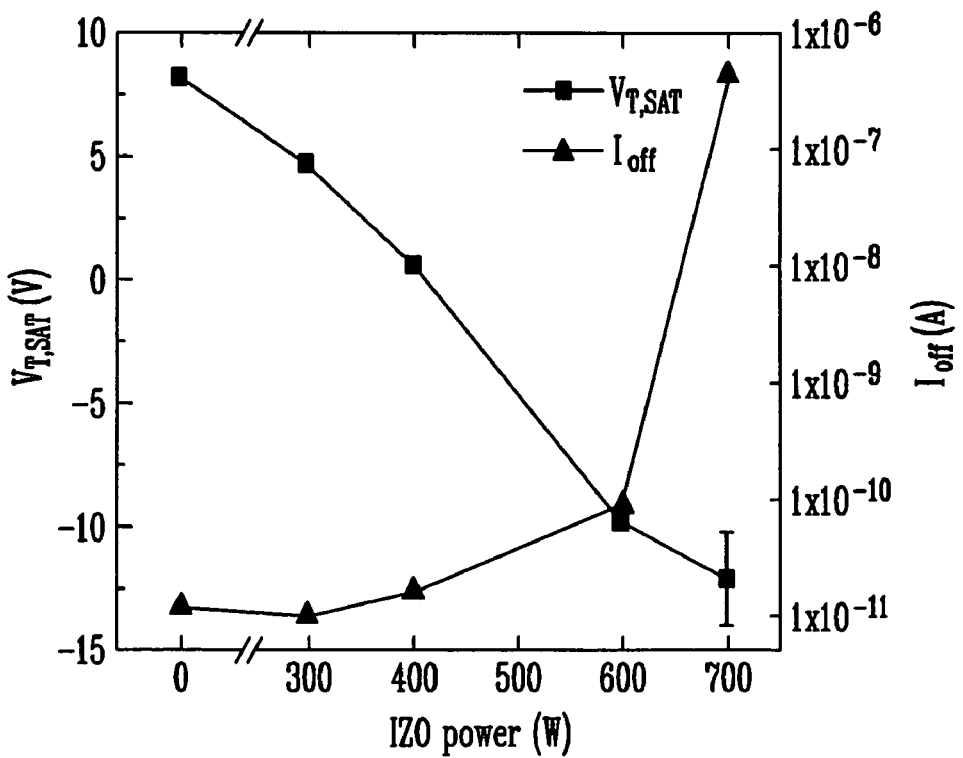
FIG. 5 illustrates a graph showing threshold voltage and OFF current characteristics of a thin film transistor according to an embodiment.

FIG. 5 illustrates a graph of threshold voltage ($V_{T,sat}$) and leakage current (OFF current $I_{OFF}$) characteristics with respect to the bias power applied to the second target, i.e., the InZnO target. As shown in FIG. 5, the threshold voltage ($V_{T,sat}$) may be controlled according to the bias power applied to the InZnO target. The bias power is preferably adjusted to 600 W or less, since leakage current increases rapidly if the bias power is increased up to 700 W or more. Additionally, as the amount of In increased, i.e., as the bias power applied to the second target increased, the threshold voltage ($V_{T,sat}$) slowly decreased. As shown in FIG. 5, the thin film transistor changed from accumulation mode to depletion mode (threshold voltage ($V_{T,sat}$) of −12.1±1.91 V) when the bias power was 700 W.

While not being bound by theory, it is believed that the decrease in the mobility ($\mu_{FE}$) associated with the high bias power applied to the second target, i.e., the InZnO target, shown in FIG. 4 is due to the bombardment of ions having a high energy during the sputtering operation. Interfacial characteristics with a bottom gate insulator may be deteriorated by the bombardment of strong ions. Also, the generation of deep level defects by the bombardment of ions under the high bias power condition and/or incorporation of sputtering ions such as argon (Ar+) in the thin film may adversely affect the device characteristics. Evidence of such is shown by the changes in the gate voltage and increases in the density of interface trap states ($N_t$) under the bias power condition of 600 W or more. Table 1, below, provides additional data in this regard.

Table 1 tabulates the changes in the relative amounts of the cations (In, Ga and Zn) in the IGZO layer and density of interface trap states ($N_t$) with respect to the bias power applied to the second target, i.e., the InZnO target. The data shown in Table 1 reflects the use of the InGaZnO target as the first target and the InZnO target as the second target. As shown in Table 1, increases in the bias power applied to the second target resulted in an improved deposition rate and increased relative proportion of In. Thus, the amount of the In deposited from the InZnO target may be increased by the improved deposition rate.

TABLE 1

| RF power of IZO target | 0 W | 300 W | 400 W | 600 W | 700 W |
|---|---|---|---|---|---|
| In/(In + Ga + Zn) | 0.40 | 0.63 | 0.65 | 0.73 | 0.76 |
| Ga/(In + Ga + Zn) | 0.43 | 0.26 | 0.23 | 0.16 | 0.13 |
| Zn/(In + Ga + Zn) | 0.17 | 0.11 | 0.12 | 0.11 | 0.11 |
| $N_t$ ($10^{12}$ cm$^{-2}$) | 3.2 ± 0.18 | 1.9 ± 0.06 | 0.91 ± 0.06 | 1.5 ± 0.03 | 1.8 ± 0.27 |

As seen from the Table 1, according to embodiments, the compositional ratio of In the IGZO active layer may be adjusted to be about 45 atomic % to about 80 atomic %. Preferably, the compositional ratio of In is adjusted to be about 55 atomic % to about 75 atomic %, which may optimize mobility and improve the slope factor S.

Table 2 below compares measured characteristics of a thin film transistor ("Ref") formed using a single InGaZnO target (molar ratio of In:Ga:Zn=1:1:1) against those of a thin film transistor ("Cosputtered") manufactured according to an embodiment, i.e., using first and second targets. Each had an IGZO active layer that was 50 nm thick.

The measured characteristics included field-effect mobility ($\mu_{FE}$), slope factor S (S), ON/OFF current ratio ($I_{on/off}$), threshold voltage ($V_{T,sat}$), and density of interface trap states ($N_t$). As shown in Table 2, the field-effect mobility ($\mu_{FE}$) and the slope factor S in the cosputtered thin film transistor were 19.3±0.74 cm$^2$/Vs and 0.36±0.02 V/dec, respectively. This data indicates that the cosputtered thin film transistor was significantly improved when compared to the reference thin film transistor manufactured using a single InGaZnO target. Further, it can be seen that the improvement in the slope factor S is due to the decrease in the density of interface trap states ($N_t$).

TABLE 2

| Sample ID | $\mu_{FE}$ (cm$^2$/Vs) | S (V/dec) | $I_{on/off}$ ratio | $V_{T,sat}$ (V) | $N_t$ (cm$^{-2}$) |
|---|---|---|---|---|---|
| Ref (50 nm) | 11.2 ± 2.01 | 1.12 ± 0.07 | 6.5 × 10 | 8.14 ± 0.36 | 2.9 × 10$^{12}$ |
| Cosputtered (50 nm) | 19.3 ± 0.74 | 0.36 ± 0.02 | 1.5 × 10 | 0.59 ± 0.32 | 9.1 × 10$^{11}$ |

Figure 6A:
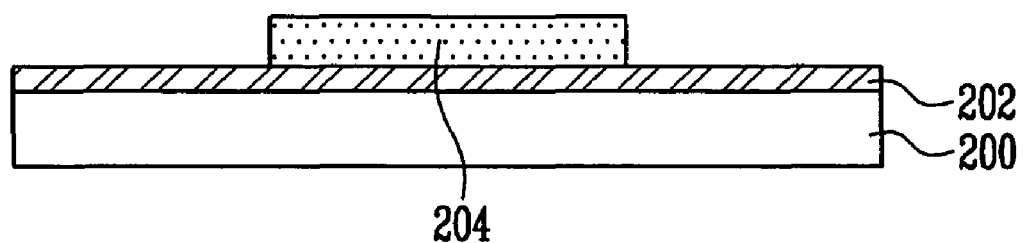
FIGS. 6A and 6B illustrate cross-sectional views of stages in a method of manufacturing a top gate thin film transistor according to an embodiment.
Figure 6B:
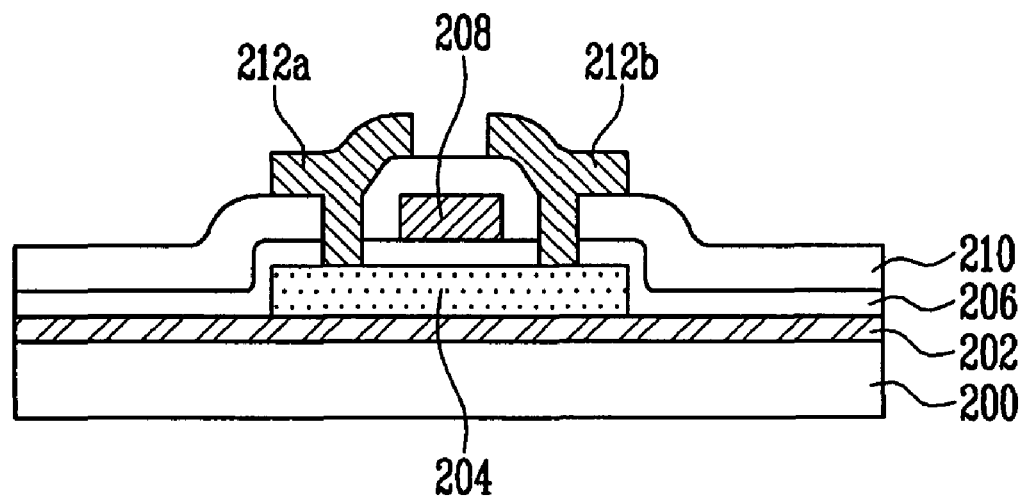

FIGS. 6A and 6B illustrate cross-sectional views of stages in a method of manufacturing a top gate thin film transistor according to an embodiment. Referring to FIG. 6A, a buffer layer 202 may be formed on a substrate 200, and an active layer 204 providing a channel region, a source region and a drain region may be formed on the buffer layer 202.

The active layer 204 may be formed according to the method of manufacturing a semiconductor active layer shown in FIG. 1. Ions of In, Ga and Zn may be deposited from the InGaZnO target 22 and the InZnO target 24 to form the IGZO active layer 204 on the substrate 200. The compositional ratio of In in the IGZO layer may be adjusted to be, e.g., about 45 atomic % to about 80 atomic %. The compositional ratio of In in the IGZO active layer 204 may be controlled by, e.g., adjusting the intensity of a bias power, the intensity of an electron beam, the intensity of a pulsed laser, or the molar ratio of In and Zn in the InZnO target 24.

Referring to FIG. 6B, a gate insulator 206 may be formed on the entire surface of the substrate 200, including on the IGZO active layer 204, and a gate electrode 208 may be formed on the gate insulator 206 over the channel region of the active layer 204. An interlayer insulator 210 may be formed on the gate electrode 208, and the interlayer insulator 210 and the gate insulator 206 may be patterned to form contact holes so as to expose a predetermined region of the source and drain regions. Source and drain electrodes 212a and 212b may be formed to contact the source and drain regions, respectively, of the IGZO active layer 204 through the contact holes.

As described above, embodiments may provide a method of manufacturing a semiconductor active layer capable of controlling a compositional ratio of cations in an IGZO active layer, a method of manufacturing a thin film transistor using the same and a thin film transistor having the semiconductor active layer. Electrical characteristics of the thin film transistor may thus be improved. The cations of In, Ga and Zn may be deposited from a first InGaZnO target and a second InZnO target to form the IGZO active layer on the substrate. A compositional ratio of In in the IGZO active layer so formed may be about 45 atomic % to 80 atomic %, and may be controlled by increasing a deposition rate of the In and Zn ions from the second InZnO target. The electrical characteristics, including mobility and slope factor S, of the thin film transistor may be improved by employing as the active layer the IGZO semiconductor having an increased In content.

Example embodiments of the present invention have been disclosed herein, and although specific terms are employed, they are used and are to be interpreted in a generic and descriptive sense only and not for purpose of limitation. For example, the codeposition approach described herein may employ two targets, as in the examples set forth above, or more than two targets. Additionally, the codeposition approach described herein may be employed to manufacture IGZO layers having atomic compositions other than those described in the examples above, or may be employed to manufacture other oxide or non-oxide layers. Further, while the above embodiments describe the manufacture of a thin film transistor as a specific example, other semiconductor devices may also be manufactured. Accordingly, it will be understood by those of ordinary skill in the art that various changes in form and details may be made without departing from the spirit and scope of the present invention as set forth in the following claims.

What is claimed is:

1. A method of manufacturing an IGZO active layer, the method comprising:
   depositing ions including In, Ga, and Zn from a first target; and
   depositing ions including In from a second target having a different atomic composition from the first target, the second target being made of InZnO, wherein the deposition of ions from the second target is controlled to adjust an atomic % of In in the IGZO layer to be about 45 atomic % to about 80 atomic %.

2. The method as claimed in claim 1, wherein the atomic % of In in the IGZO layer is about 55 atomic % to about 75 atomic %.

3. The method as claimed in claim 1, wherein the atomic % of In in the IGZO layer is about 60 atomic % to about 70 atomic %.

4. The method as claimed in claim 1, wherein the first target includes In, Ga, and Zn in a molar ratio of about 1:1:1.

5. The method as claimed in claim 1, wherein the first target is made of InGaZnO.

6. The method as claimed in claim 5, wherein:
the first target includes In, Ga, and Zn in a molar ratio of about 1:1:1, and
the second target includes In and Zn in a molar ratio of about 1:1 to about 6:1 (In:Zn).

7. The method as claimed in claim 1, wherein the atomic % of In in the IGZO layer is adjusted by adjusting a molar ratio of In:Zn in the second target.

8. The method as claimed in claim 1, wherein first and second bias powers are applied to the first target and the second target, respectively, and the atomic % of In in the IGZO layer is adjusted by adjusting the intensity of the second bias power.

9. The method as claimed in claim 1, wherein the first target and the second target are irradiated with first and second pulsed lasers, and the atomic % of In in the IGZO layer is adjusted by adjusting the intensity of the second pulsed laser.

10. A method of manufacturing a thin film transistor, the method comprising:
forming an IGZO active layer on a substrate;
forming a gate electrode spaced apart from the IGZO active layer by a gate dielectric layer;
forming a source electrode that contacts a first portion of the IGZO active layer; and
forming a drain electrode that contacts a second portion of the IGZO active layer, wherein forming the IGZO active layer includes:
depositing ions including In, Ga, and Zn from a first target, and
depositing ions including In from a second target having a different atomic composition from the first target, the second target being made of InZnO, the deposition of ions from the second target being controlled to adjust an atomic % of In in the IGZO layer to be about 45 atomic % to about 80 atomic %.

11. The method as claimed in claim 10, wherein the atomic % of In in the IGZO layer is about 55 atomic % to about 75 atomic %.

12. The method as claimed in claim 10, wherein the atomic % of In in the IGZO layer is about 60 atomic % to about 70 atomic %.

13. The method as claimed in claim 10, wherein the first target includes In, Ga, and Zn in a molar ratio of about 1:1:1.

14. The method as claimed in claim 10, wherein the first target is made of InGaZnO.

15. The method as claimed in claim 14, wherein:
the first target includes In, Ga, and Zn in a molar ratio of about 1:1:1, and
the second target includes In and Zn in a molar ratio of about 1:1 to about 6:1 (In:Zn).

16. The method as claimed in claim 10, wherein the atomic % of In in the IGZO layer is adjusted by adjusting a molar ratio of In:Zn in the second target.

17. The method as claimed in claim 10, wherein first and second bias powers are applied to the first target and the second target, respectively, and the atomic % of In in the IGZO layer is adjusted by adjusting the intensity of the second bias power.

18. The method as claimed in claim 10, wherein the first target and the second target are irradiated with first and second pulsed lasers, and the atomic % of In in the IGZO layer is adjusted by adjusting the intensity of the second pulsed laser.

19. The method as claimed in claim 10, wherein:
the gate dielectric layer is on the gate electrode such that the gate electrode is between the gate dielectric layer and the substrate, and
the IGZO active layer is on the gate dielectric layer.

20. The method as claimed in claim 10, wherein:
the gate dielectric layer is on the IGZO active layer such that the IGZO active layer is between the gate dielectric layer and the substrate, and
the gate electrode is on the gate dielectric layer.

* * * * *